(12) United States Patent
Long

(10) Patent No.: US 11,251,223 B2
(45) Date of Patent: Feb. 15, 2022

(54) ARRAY SUBSTRATE, METHOD OF MANUFACTURING THE SAME, AND DISPLAY DEVICE

(71) Applicant: BOE Technology Group Co., Ltd., Beijing (CN)

(72) Inventor: Chunping Long, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 463 days.

(21) Appl. No.: 16/335,453

(22) PCT Filed: Nov. 29, 2018

(86) PCT No.: PCT/CN2018/118122
§ 371 (c)(1),
(2) Date: Mar. 21, 2019

(87) PCT Pub. No.: WO2019/174308
PCT Pub. Date: Sep. 19, 2019

(65) Prior Publication Data
US 2021/0343780 A1 Nov. 4, 2021

(30) Foreign Application Priority Data
Mar. 16, 2018 (CN) .......................... 201810220601.1

(51) Int. Cl.
*H01L 27/14* (2006.01)
*H01L 27/15* (2006.01)
(Continued)

(52) U.S. Cl.
CPC .......... *H01L 27/156* (2013.01); *H01L 27/124* (2013.01); *H01L 27/1222* (2013.01);
(Continued)

(58) Field of Classification Search
CPC ... H01L 27/56; H01L 27/1222; H01L 27/124; H01L 27/1251; H01L 33/005; H01L 33/12; H01L 33/38; H01L 33/62
(Continued)

(56) References Cited

U.S. PATENT DOCUMENTS 10,373,985 B2 * 8/2019 Kim .................... H01L 27/1248
10,374,124 B2 * 8/2019 Jang ........................ H01L 33/06
(Continued)

FOREIGN PATENT DOCUMENTS

| CN | 106816545 A | 6/2017 |
| CN | 107393940 A | 11/2017 |
| JP | S61164290 A | 7/1986 |

OTHER PUBLICATIONS

International Search Report and Written Opinion of the International Searching Authority (with English language translation of Written Opinion), International Application No. PCT/CN2018/118122, dated Feb. 13, 2019, 11 pp.
(Continued)

*Primary Examiner* — Tan N Tran
(74) *Attorney, Agent, or Firm* — Myers Bigel, P.A.

(57) ABSTRACT

An array substrate includes a base substrate, a thin film transistor on the base substrate, including a gate electrode connected to a gate line, an active layer, a gate insulating layer insulating the gate electrode from the active layer, a first electrode connected to a data line, and a second electrode spaced apart from the first electrode, and a micro light emitting diode on the base substrate, including a first electrode, a first buffer layer, a light emitting layer, and a second electrode, which are stacked on top of each other. The first buffer layer is in a same layer as the active layer. The second electrode of the thin film transistor is connected to one of the
(Continued)

first electrode of the micro light emitting diode or the second electrode of the micro light emitting diode.

20 Claims, 9 Drawing Sheets

(51) Int. Cl.
    *H01L 27/12*     (2006.01)
    *H01L 33/00*     (2010.01)
    *H01L 33/12*     (2010.01)
    *H01L 33/38*     (2010.01)
    *H01L 33/62*     (2010.01)

(52) U.S. Cl.
    CPC ........ *H01L 27/1251* (2013.01); *H01L 33/005* (2013.01); *H01L 33/12* (2013.01); *H01L 33/38* (2013.01); *H01L 33/62* (2013.01); *H01L 2933/0016* (2013.01); *H01L 2933/0066* (2013.01)

(58) Field of Classification Search
    USPC ............................................. 257/59, 72, 432
    See application file for complete search history.

(56) References Cited

U.S. PATENT DOCUMENTS

| | | |
|---|---|---|
| 2009/0072267 A1 | 3/2009 | Goshonoo et al. |
| 2014/0291666 A1 | 10/2014 | Tsang |
| 2015/0108450 A1* | 4/2015 | Son .................... H01L 27/3276 257/40 |
| 2015/0187853 A1* | 7/2015 | Jin ...................... H01L 27/3262 257/40 |
| 2016/0020248 A1 | 1/2016 | Blanchard et al. |
| 2017/0179192 A1 | 6/2017 | Zhang et al. |
| 2017/0309676 A1 | 10/2017 | Odnoblyudov et al. |

OTHER PUBLICATIONS

Extended European Search Report corresponding to EP 18852790.7; dated Nov. 12, 2021 (9 pages).

* cited by examiner

| Form a thin film transistor and a micro LED on a base substrate, wherein a first buffer layer of the micro LED is formed in the same layer as an active layer of the thin film transistor | 101 |

| Connect the second electrode of the thin film transistor to the first or second electrode of the micro LED | 102 |

ARRAY SUBSTRATE, METHOD OF MANUFACTURING THE SAME, AND DISPLAY DEVICE

CROSS-REFERENCE TO RELATED APPLICATIONS

The present application is a 35 U.S.C. 371 national stage application of PCT International Application No. PCT/CN2018/118122, filed on Nov. 29, 2018, which claims the benefit of Chinese Patent Application No. 201810220601.1 filed on Mar. 16, 2018, the contents of which are incorporated herein by reference in their entireties.

TECHNICAL FIELD

The present application relates to the field of display technologies, and in particular, to an array substrate, a method of manufacturing the array substrate, and a display device.

BACKGROUND

A micro light emitting diode (micro LED) is a light emitting device using an inorganic material, such as gallium nitride, as a luminescent material, and has a typical size in the range of, for example, 10 µm to 15 µm. A display device using micro LEDs as light emitting devices has advantages such as high brightness, fast response speed, and high stability.

In the manufacture of the micro LED display device, thin film transistors arranged in an array are generally formed on a glass substrate, and a plurality of micro LEDs are formed on the monocrystalline silicon substrate. The monocrystalline silicon substrate is then diced to obtain a plurality of individual micro LEDs. Finally, the individual micro LEDs are transferred to corresponding areas on an array substrate.

SUMMARY

In accordance with an aspect of the present disclosure, an array substrate is provided, comprising a base substrate; a thin film transistor on the base substrate, the thin film transistor comprising a gate electrode connected to a gate line, an active layer, a gate insulating layer insulating the gate electrode from the active layer, a first electrode connected to a data line, and a second electrode spaced apart from the first electrode; and a micro light emitting diode on the base substrate, the micro light emitting diode comprising a first electrode, a first buffer layer, a light emitting layer and a second electrode, which are stacked on top of each other, the first buffer layer and the active layer being in a same layer. The second electrode of the thin film transistor is connected to one of the first electrode of the micro light emitting diode or the second electrode of the micro light emitting diode.

In some embodiments, the micro light emitting diode further comprises a first semiconductor layer between the light emitting layer and the first buffer layer, and a second semiconductor layer between the light emitting layer and the second electrode of the micro light emitting diode.

In some embodiments, the micro light emitting diode further comprises a second buffer layer between the first semiconductor layer and the first buffer layer, and the first buffer layer and the active layer are made of a same material.

In some embodiments, the first buffer layer comprises at least one of graphene, zinc oxide, zinc sulfide, silicon carbide, or aluminum nitride, and the second buffer layer comprises at least one of gallium nitride, gallium arsenide, aluminum gallium arsenide, aluminum gallium nitride, or indium phosphide.

In some embodiments, the thin film transistor is of a top gate structure. The first electrode of the micro light emitting diode, the first electrode of the thin film transistor, and the second electrode of the thin film transistor are in a same layer, the second electrode of the thin film transistor is connected to the second electrode of the micro light emitting diode through a first contact via in the gate insulating layer, and the first electrode of the micro light emitting diode is configured to receive a common electrode voltage.

In some embodiments, the thin film transistor is of a top gate structure. The first electrode of the micro light emitting diode, the first electrode of the thin film transistor, and the second electrode of the thin film transistor are in the same layer, the second electrode of the thin film transistor and the first electrode of the micro light emitting diode are of an integral structure, and the second electrode of the micro light emitting diode is configured to receive a common electrode voltage.

In some embodiments, the thin film transistor is of a bottom gate structure. The first electrode of the micro light emitting diode and the gate electrode are in a same layer and spaced apart from each other. The array substrate further comprises a passivation layer on a side of the first and second electrodes of the thin film transistor away from the base substrate. The second electrode of the thin film transistor is connected to the second electrode of the micro light emitting diode through a second contact via in the passivation layer, and the first electrode of the micro light emitting diode is configured to receive a common electrode voltage.

In some embodiments, the thin film transistor is of a bottom gate structure. The first electrode of the micro light emitting diode and the gate electrode are in a same layer and spaced apart from each other. The thin film transistor further comprises a protective layer on a side of the active layer away from the base substrate. The first and second electrodes of the thin film transistor are on a side of the protective layer away from the base substrate, the first electrode of the thin film transistor is connected to the active layer through a first via in the protective layer, the second electrode of the thin film transistor is connected to the active layer through a second via in the protective layer, the second electrode of the thin film transistor is further connected to the first electrode of the micro light emitting diode through a third contact via in the protective layer, and the second electrode of the micro light emitting diode is configured to receive a common electrode voltage.

According to another aspect of the present disclosure, a method of manufacturing an array substrate is provided, comprising forming a thin film transistor and a micro light emitting diode on a base substrate, the thin film transistor comprising a gate electrode connected to a gate line, an active layer, a gate insulating layer insulating the gate electrode from the active layer, a first electrode connected to a data line, and a second electrode spaced apart from the first electrode, the micro light emitting diode comprising a first electrode, a first buffer layer, a light emitting layer and a second electrode, which are stacked on top of each other, wherein the first buffer layer and the active layer are in a same layer; and connecting the second electrode of the thin film transistor to one of the first electrode of the micro light emitting diode or the second electrode of the micro light emitting diode.

In some embodiments, the micro light emitting diode further comprises a first semiconductor layer and a second semiconductor layer. The forming the micro light emitting diode comprises sequentially forming, in a direction away from the base substrate, the first electrode of the micro light emitting diode, the first buffer layer, the first semiconductor layer, the light emitting layer, the second semiconductor layer, and the second electrode of the micro light emitting diode.

In some embodiments, prior to the forming the first semiconductor layer, the method further comprises forming a second buffer layer on a side of the first buffer layer away from the base substrate. The first semiconductor layer is formed on a side of the second buffer layer away from the base substrate, and the first buffer layer and the active layer are formed of a same material.

In some embodiments, the thin film transistor is of a top gate structure. The forming the thin film transistor and the micro light emitting diode comprises integrally forming the second electrode of the thin film transistor and the first electrode of the micro light emitting diode by a one-time patterning process.

In some embodiments, the thin film transistor is of a top gate structure. After the forming the thin film transistor, the method further comprises forming a first contact via that extends through the gate insulating layer to expose the second electrode of the thin film transistor. The second electrode of the micro light emitting diode is formed after formation of the first contact via, and is connected to the second electrode of the thin film transistor through the first contact via.

In some embodiments, the thin film transistor is of a bottom gate structure. The forming the thin film transistor and the micro light emitting diode comprises forming in a same layer the first electrode of the micro light emitting diode and the gate electrode by a one-time patterning process.

In some embodiments, after the forming the thin film transistor, the method further comprises forming a passivation layer on a side of the first and second electrodes of the thin film transistor away from the base substrate; and forming a second contact via that extends through the passivation layer to expose the second electrode of the thin film transistor. The second electrode of the micro light emitting diode is formed after formation of the contact via, and is connected to the second electrode of the thin film transistor through the second contact via.

In some embodiments, after the forming the active layer, the method further comprises forming a protective layer on a side of the active layer away from the base substrate; and exposing the active layer by forming a first via and a second via in the protective layer and exposing the first electrode of the micro light emitting diode by forming a third contact via in the protective layer. The first and second electrodes of the thin film transistor are formed on a side of the protective layer away from the base substrate, the first electrode of the thin film transistor is connected to the active layer through the first via, and the second electrode of the thin film transistor is connected to the active layer through the second via and connected to the first electrode of the micro light emitting diode through the third contact via.

According to yet another aspect of the present disclosure, a display device is provided comprising any one of the array substrates described above.

DETAILED DESCRIPTION

Figure 1:
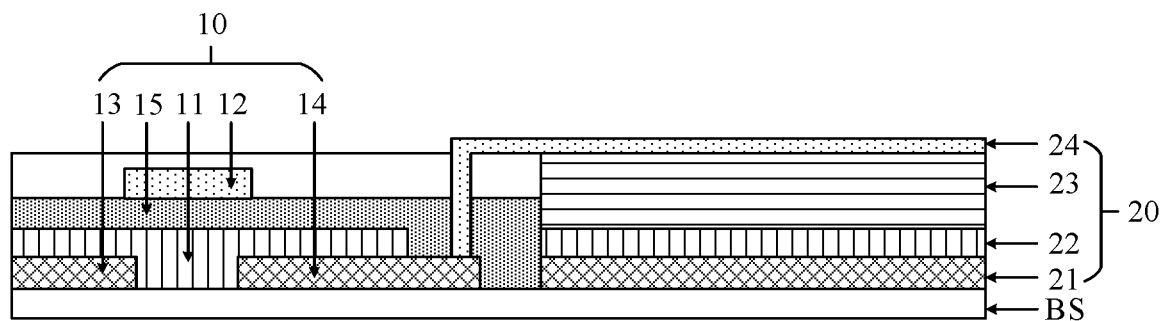
FIG. 1 is a schematic cross-sectional view of an array substrate in accordance with an embodiment of the present disclosure.

Embodiments of the present disclosure will be further described in detail below with reference to the accompanying drawings, in order to render clear the objectives, the technical solutions and the advantages of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a schematic cross-sectional view of an array substrate in accordance with an embodiment of the present disclosure. This array substrate may include a plurality of pixels arranged in an array, although only a single one of them is shown for convenience of illustration.

Referring to FIG. 1, the pixel includes a thin film transistor 10 and a micro LED 20 disposed on a base substrate BS. The thin film transistor 10 is used to drive the micro LED 20 to emit light. The thin film transistor 10 includes a gate electrode 12, an active layer 11, a gate insulating layer 15 that insulates the gate electrode 12 from the active layer 11, a first electrode 13, and a second electrode 14 spaced apart from the first electrode 13. As shown in FIG. 1, the active layer 11 is filled between the first electrode 13 and the second electrode 14, and in this example also covers at least a portion of the first electrode 13 and at least a portion of the second electrode 14. The micro LED 20 includes a first electrode 21, a first buffer layer 22, a light emitting layer 23, and a second electrode 24 which are stacked on top of each other. The first buffer layer 22 may be disposed in the same layer as the active layer 11.

The gate electrode 12 of the thin film transistor 10 is connected to a gate line (not shown in FIG. 1), the first electrode 13 of the thin film transistor 10 is connected to a data line (not shown in FIG. 1), and the second electrode 14 of the thin film transistor 10 is connected to the first electrode 21 or the second electrode 24. One of the first electrode 21 and the second electrode 24 that is not connected to the second electrode 14 of the thin film transistor 10 may receive a common electrode voltage as a common electrode, and may be referred to as a cathode, and the other one of the first electrode 21 and the second electrode 24 that is connected to the second electrode 14 of the thin film transistor 10 may be referred to as an anode.

In the example of FIG. 1, the second electrode 14 of the thin film transistor 10 is connected to the second electrode 24 of the micro LED 20, and the first electrode 21 of the micro LED 20 may be connected to a common electrode line (not shown) for reception of a common electrode voltage. The first electrode 13 of the thin film transistor 10 may be a source electrode, and the second electrode 14 of the thin film transistor 10 may be a drain electrode. Alternatively, the first electrode 13 may be a drain electrode, and the second electrode 14 may be a source electrode. The first electrode 21 of the micro LED 20 may be an N-type electrode, and the second electrode 24 of the micro LED 20 may be a P-type electrode. In some embodiments, the micro LEDs of the individual pixels may share the anode, i.e. the anodes of the micro LEDs of the pixels may be the same electrode.

The light emitting layer 23 in the micro LED 20 may be formed of a material of a group III-V compound (including a binary compound, a ternary compound, or a quaternary compound, etc.). The III-V compound refers to a compound formed of a group III element and a group V element in the periodic table, with the group III element including boron (B), aluminum (Al), gallium (Ga), and indium (In), etc., and the group V element including nitrogen (N), phosphorus (P), arsenic (As), and antimony (Sb). The III-V compound generally includes gallium arsenide (GaAs), indium phosphide (InP), gallium nitride (GaN), and the like. The semiconductor light emitting layer formed of the III-V compound material has high luminous efficiency, good stability, and a long life.

In operation, the common electrode voltage applied to the cathode electrode (the first electrode 21 in this example) through the common electrode line may be different from the common electrode voltage for a conventional display device. For example, the common electrode voltage in the conventional display device may be 0 volt (V), or near 0 V, for example, −5 V to 5 V, whereas in the array substrate of the embodiment of the present disclosure, the voltage applied to the cathode electrode may not be limited to the above range. Depending on the operational requirements (luminous brightness or luminous efficiency) of the micro LED, the applied cathode voltage ranges from −20 V to 20 V, typically not 0 V.

Figure 2A:
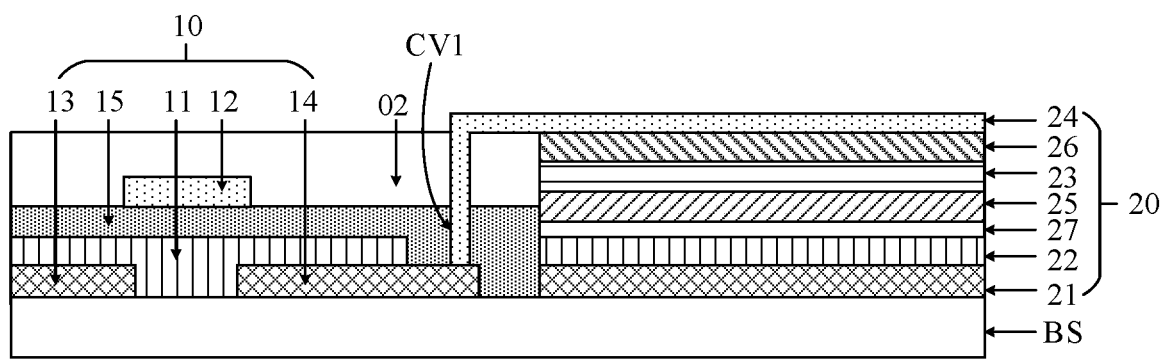
FIG. 2A is a schematic cross-sectional view of an array substrate according to another embodiment of the present disclosure.

FIG. 2A is a schematic cross-sectional view of an array substrate in accordance with another embodiment of the present disclosure. The same elements as in FIG. 1 are denoted by the same reference numerals and will not be described in detail here.

Referring to FIG. 2A, the micro LED 20 further includes a first semiconductor layer 25 disposed between the light emitting layer 23 and the first buffer layer 22, and a second semiconductor layers 26 disposed between the light emitting layer 23 and the second electrode 24. In this example, the first semiconductor layer 25 may be an N-type semiconductor layer, and the second semiconductor layer 26 may be a P-type semiconductor layer. The N-type semiconductor layer may be made of a Group III-V compound material doped with a Group IV element, for example, a GaN material doped with silicon (Si) atoms. The P-type semiconductor layer may be made of a Group III-V compound material doped with a Group II element, for example, a GaN material doped with magnesium (Mg) atoms.

With continued reference to FIG. 2A, the micro LED further includes a second buffer layer 27 disposed between the first semiconductor layer 25 and the first buffer layer 22. The first buffer layer 22 and the active layer 11 may be made of the same material. The first buffer layer 22 is doped with ions, for example, phosphorus ions, boron ions or arsenic ions. The second buffer layer 27 and the first buffer layer 22 are made of different materials, and a difference between the lattice constant of the second buffer layer 27 material and the lattice constant of the first buffer layer 22 material is less than a preset threshold. That is, the crystal structures of the materials of these two buffer layers are the same or similar, so that the first buffer layer 22 can facilitate the epitaxial growth of the second buffer layer 27, and ensure the epitaxial growth quality of the second buffer layer 27.

By way of example and not limitation, the active layer 11 and the first buffer layer 22 may be made of graphene, zinc oxide (ZnO), zinc sulfide (ZnS), silicon carbide (SiC) or aluminum nitride (AlN), or any combination thereof, and the second buffer layer 27 may be made of a Group III-V compound material such as gallium nitride (GaN), gallium arsenide (GaAs), aluminum gallium arsenide (AlGaAs), aluminum gallium nitride (AlGaN) or indium phosphide (InP), or any combination thereof. Due to its mobility that is tens to thousands times higher than that of materials such as amorphous silicon, oxide and polycrystalline silicon, graphene can provide a more stable threshold voltage for thin film transistors, which is beneficial to the lifetime of the array substrate.

In addition, as shown in FIG. 2A, the thin film transistor 10 is of a top gate structure in which the active layer 11 is disposed on a side of the first electrode 13 and the second electrode 14 away from the base substrate BS, the gate insulating layer 15 is disposed at a side of the active layer 11 away from the base substrate BS, and the gate electrode 12 is disposed on a side of the gate insulating layer 15 away from the base substrate BS. The first electrode 21 of the micro LED 20, the first electrode 13 of the thin film transistor 10, and the second electrode 14 of the thin film transistor 10 are disposed in the same layer. A first contact via CV1 capable of exposing the second electrode 14 is formed in the gate insulating layer 15 such that the second electrode 14 can be connected to the second electrode 24 through the first contact via CV1. In this example, since a passivation layer 02 is disposed on a side of the second electrode 14 of the thin film transistor 10 away from the base substrate BS, the first contact via CV1 further extends through the passivation layer 02.

Figure 2B:
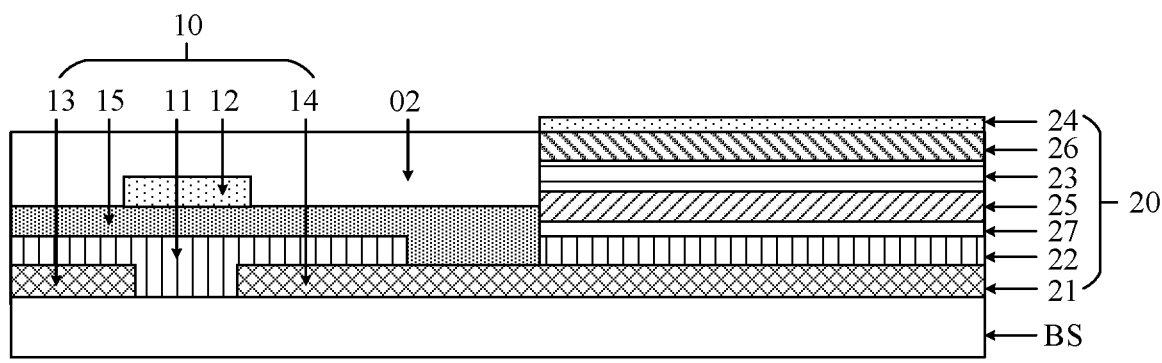
FIG. 2B is a schematic cross-sectional view of a variation of the array substrate of FIG. 2A.

FIG. 2B is a schematic cross-sectional view of a variation of the array substrate of FIG. 2A. The same elements as in FIG. 2A are denoted by the same reference numerals and will not be described in detail here.

As shown in FIG. 2B, the second electrode 14 of the thin film transistor 10 and the first electrode 21 of the micro LED 20 are of an integral structure formed by a one-time patterning process. That is, a portion of the integral structure in contact with the active layer 14 forms the second electrode 14 of the thin film transistor 10, and a portion of the integral structure in contact with the first buffer layer 22 forms the first electrode 21 of the micro LED 20. In this case, the second electrode 24 of the micro LED 20 may function as a common electrode to receive a common electrode voltage.

Figure 2C:
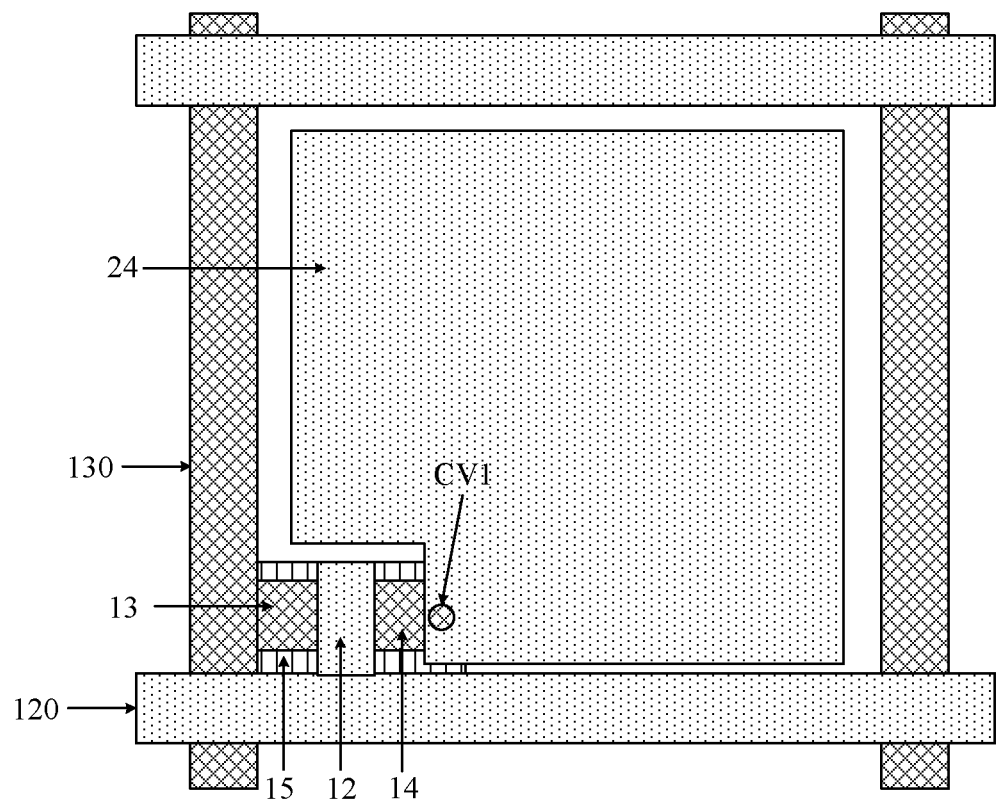
FIG. 2C is a schematic plan view showing a structure of the array substrate of FIG. 2A.

FIG. 2C is a schematic plan view of a structure of the array substrate of FIG. 2A. Referring to FIGS. 2A and 2C, the second electrode 14 is connected to the second electrode 24 through the first contact via CV1. Further, the first electrode 13 of the thin film transistor 10 is connected to a data line 130, and the gate electrode 12 of the thin film transistor 10 is connected to a gate line 120, as can be seen from FIG. 2C.

Figure 3A:
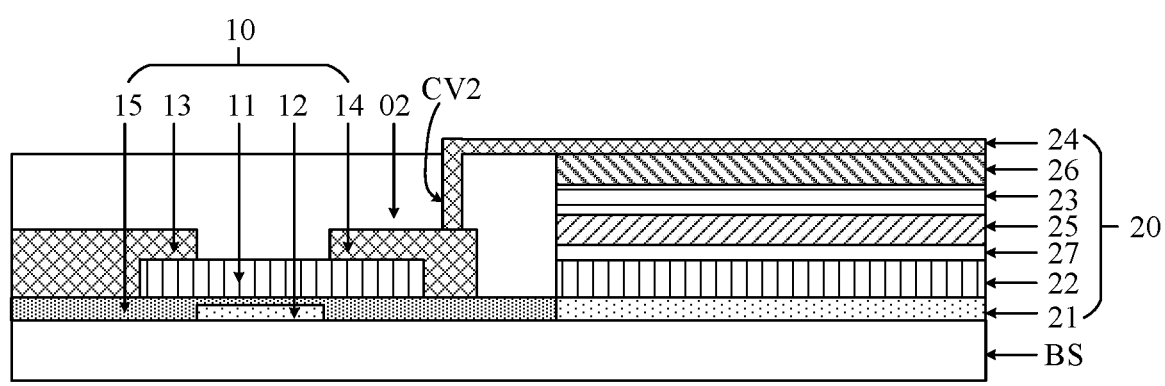
FIG. 3A is a schematic cross-sectional view of an array substrate in accordance with another embodiment of the present disclosure.

FIG. 3A is a schematic cross-sectional view of an array substrate in accordance with another embodiment of the present disclosure.

As shown in FIG. 3A, the thin film transistor 10 is of a bottom gate structure in which the gate electrode 12 is disposed on the base substrate BS, the gate insulating layer 15 is disposed on the base substrate BS and covers the gate electrode 12, and the first electrode 13 and the second electrode 14 are disposed on a side of the gate insulating layer 15 away from the base substrate BS and are in contact with the active layer 11. The first electrode 21 of the micro LED 20 is disposed in the same layer as the gate electrode 12 of the thin film transistor 10 and is spaced apart from the gate electrode 12 of the thin film transistor 10.

The passivation layer 02 is disposed on a side of the second electrode 14 of the thin film transistor 10 away from the base substrate BS and is provided with a second contact via CV2. The second electrode 14 can be connected to the second electrode 24 of the micro LED 20 through the second contact via CV2.

Figures 3B, 4:
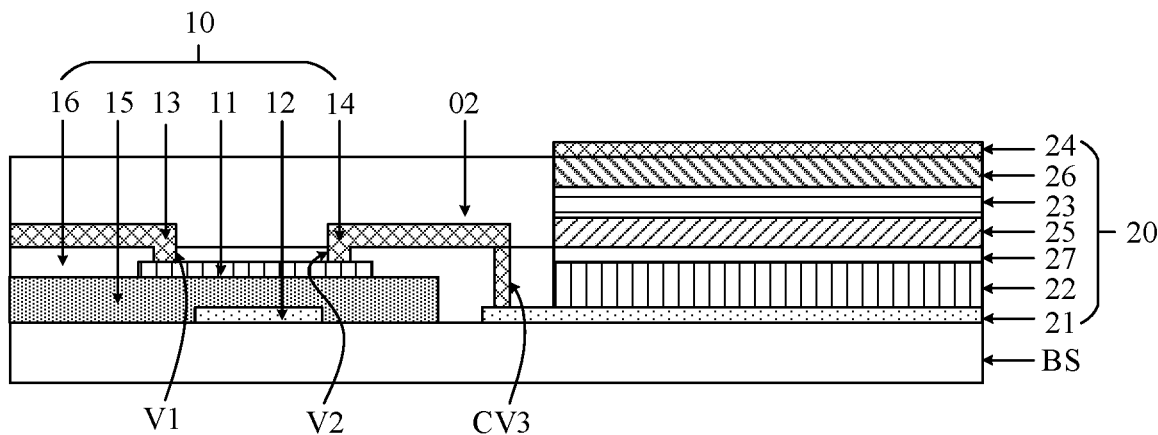
FIG. 3B is a schematic cross-sectional view of a variation of the array substrate of FIG. 3A.
FIG. 4 is a flow chart of a method of manufacturing an array substrate in accordance with an embodiment of the present disclosure.

FIG. 3B is a schematic cross-sectional view of an array substrate in accordance with another embodiment of the present disclosure. The same elements as in FIG. 3A are denoted by the same reference numerals and will not be described in detail here.

As shown in FIG. 3B, the thin film transistor 10 further includes a protective layer 16 disposed on a side of the active layer 11 away from the base substrate BS, and the first and second electrodes 13 and 14 of the thin film transistor 10 are disposed on a side of the protective layer 16 away from the base substrate BS. The first electrode 13 is connected to the active layer 11 through a first via V1, the second electrode 14 is connected to the active layer 11 through a second via V2, and the second electrode 14 is further connected to the first electrode 21 through a third contact via CV3.

In order to facilitate the connection of the second electrode 14 of the thin film transistor with the first electrode 21, as shown in FIG. 3B, a portion of the first electrode 21 may protrude from other film layers in the micro LED 20, such that the second electrode 14 may be in contact with the protruding portion of the first electrode 21.

In embodiments, by disposing the first buffer layer 22 of the micro LED 20 in the same layer as the active layer 11 of the thin film transistor 10, the micro LED 20 can be formed simultaneously in the formation of the thin film transistor 10, simplifying the manufacturing process of the array substrate and reducing the manufacturing cost of the display device.

FIG. 4 is a flow chart of a method of manufacturing an array substrate in accordance with an embodiment of the present disclosure. The method can be used to manufacture the array substrate shown in FIGS. 1 to 3B.

At step 101, a thin film transistor and a micro light emitting diode (LED) are formed on a base substrate. The micro LED includes a first electrode, a first buffer layer, a light emitting layer, and a second electrode that are stacked on top of each other. The first buffer layer is formed in the same layer as an active layer of the thin film transistor. At step 102, the second electrode of the thin film transistor is connected to the first or second electrode of the micro LED. It will be understood that although steps 101 and 102 in FIG. 4 are illustrated as being separate from each other, they may be an integral process.

By forming the buffer layer of the micro LED in the same layer as the active layer of the thin film transistor, the thin film transistor and the micro LED can be simultaneously formed in the manufacturing process, thereby effectively simplifying the manufacturing process of the array substrate and reducing the manufacturing cost of the display device. The manufacturing method provided by the embodiment of the present disclosure may have a shorter process time and a higher yield as compared to a conventional transfer process.

In the above step 101, the process of forming the micro LED may include sequentially forming the first electrode, the first buffer layer, the first semiconductor layer, the light emitting layer, the second semiconductor layer, and the second electrode in a direction away from the base substrate. Before the forming of the first semiconductor layer, the method may further include forming a second buffer layer on a side of the first buffer layer away from the base substrate. In this case, the first semiconductor layer can be formed on a side of the second buffer layer away from the base substrate. As described above, the first buffer layer and the active layer are formed of the same material, and the first buffer layer is doped with ions. The second buffer layer and the first buffer layer are formed of different materials, and a difference between the lattice constant of the material of the second buffer layer and the lattice constant of the material of the first buffer layer is less than a preset threshold, i.e., the crystal structures of the materials forming these two buffer layers are the same or similar.

By way of example and not limitation, the first buffer layer may be made of a material such as graphene, ZnO, ZnS, SiC or AlN, and the second buffer layer may be made of a material such as GaN, GaAs, AlGaAs, AlGaN or InP.

A method of manufacturing an array substrate provided by an embodiment of the present disclosure is described in detail below with an example where the thin film transistor is of a top gate structure as shown in FIG. 2A.

Figure 5A:
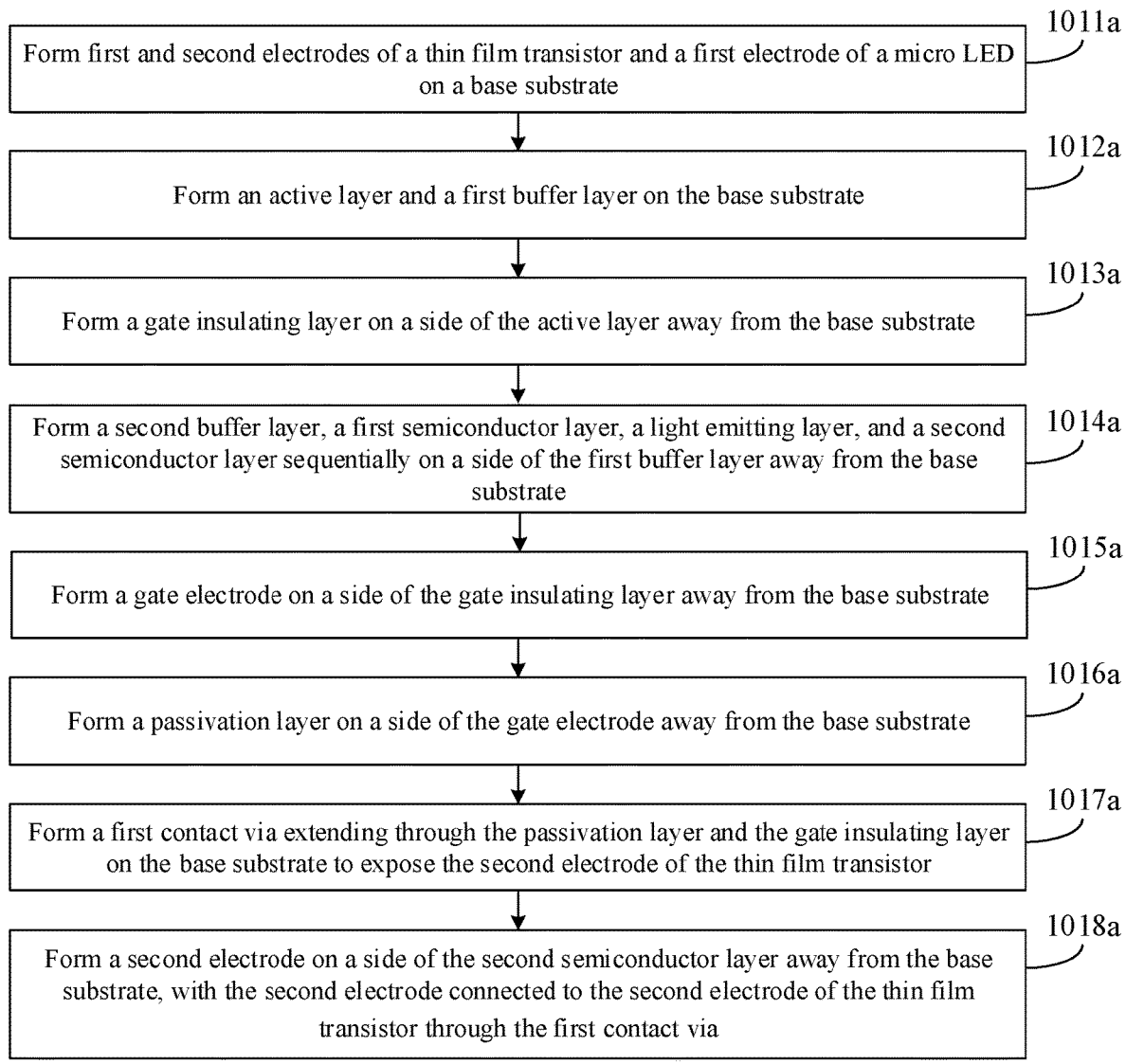
FIG. 5A is a flowchart of a method of manufacturing an array substrate according to another embodiment of the present disclosure.

Referring to FIG. 5A, the method may include the following steps.

At step 1011a, first and second electrodes of a thin film transistor and a first electrode of a micro LED are formed on a base substrate. The base substrate may be a glass substrate. The first and second electrodes of the thin film transistor and the first electrode of the micro LED are spaced apart from each other. The first electrode of the micro LED is located in an active display area of the array substrate, and the first and second electrodes of the thin film transistor are located in a non-pixel area (i.e., a non-display area) of the array substrate.

Figure 5B:
FIG. 5B is a schematic cross-sectional view showing a structure obtained by forming a metal thin film on a base substrate.

In an embodiment, as shown in FIG. 5B, a metal thin film 200 having a thickness of 200 nanometers (nm) to 500 nm may be deposited on a glass substrate BS by magnetron sputtering. The material forming the metal thin film 200 may be copper (Cu) or a copper alloy. DC magnetron sputtering or AC magnetron sputtering may be used to plating. Before the sputter plating is started, a target is cleaned for 2 minutes (min) in a plasma generated by Ar gas having a purity of 99.99%. At an ambient temperature, when the working gas pressure is 2.7 Pascal (Pa) and the flow rate of the Ar gas is 36 milliliter per minute (mL/min) under a standard condition, the sputtering power is adjusted to 100 watts (W) to prepare the metal film, for example, a copper film. The texture of the copper film first increases and then decreases as the sputtering gas pressure P and the plating distance D increase. When the sputtering gas pressure is 0.5 Pa and the plating distance is 200 mm, the copper film obtained by sputtering has the strongest texture. Moreover, the crystal grains are fine, and the film density and flatness are high.

Alternatively, the metal thin film 200 may be formed using an electroplating process. For example, an electroplating copper solution used in forming the copper film may include copper salt of 120 gram per liter (g/L) to 300 g/L, acid of 10 g/L to 200 g/L, chloride ion of 30 g/L to 80 mg/L, sulfur-containing compound of 0.001 g/L to 0.3 g/L, polyoxyether compound of 0.5 g/L to 10 g/L, polyethylene glycol of 0.05 g/L to 5 g/L, and quaternary ammonium salt of 0.001 g/L to 0.2 g/L. The process parameters of the electroplating approach may be a bath temperature of 10 degrees Celsius (° C.) to 50° C., and a current density of 0.2 amps per square decimeter (A/dm$^2$) to 20 A/dm$^2$.

Figure 5C:
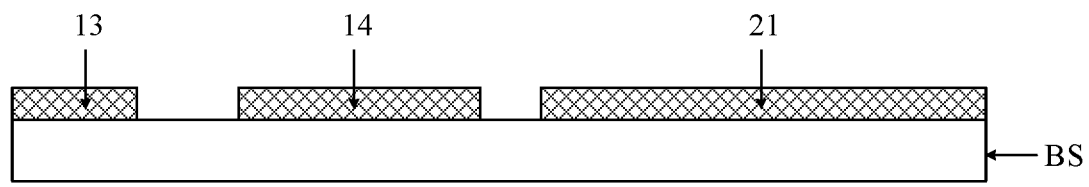
FIG. 5C is a schematic cross-sectional view showing a first electrode of a thin film transistor, a second electrode of the thin film transistor, and a first electrode of a micro LED obtained by patterning the metal thin film of FIG. 5B.

Further, a patterned photoresist mask may be formed on the surface of the metal thin film 200 by a photolithography process, and portions of the metal thin film 200 not covered by the photoresist mask may be etched to obtain the first electrode 13 of the thin film transistor, the second electrode 14 of the thin film transistor, and the first electrode 21 of the micro LED that are spaced apart from each other. For example, the metal thin film 200 may be etched at a temperature of 50° C. using an iron chloride (FeCl$_3$) etching solution. A schematic cross-sectional view of the array substrate formed at the end of step 1011a can be seen in FIG. 5C.

At step 1012a, an active layer and a first buffer layer are formed on the base substrate that are spaced from each other, with the active layer being in contact with the first and second electrodes of the thin film transistor. The active layer is located in an active region of the thin film transistor and is in contact with the first and second electrodes. The first buffer layer is located in the pixel region and covers a side of the first electrode of the micro LED that is away from the base substrate. The material forming the active layer and the first buffer layer may be graphene, ZnO, ZnS, SiC or AlN, etc., and the first buffer layer is further doped with ions, for example, N+ ions, such as phosphorus ions, boron ions or arsenic ions.

In the following, a manufacturing process of the active layer and the first buffer layer is described with an example where the metal thin film is a copper thin film and the material forming the active layer and the first buffer layer is graphene.

First, the base substrate having formed thereon the first and second electrodes of the thin film transistor and the first electrode of the micro LED is ultrasonically cleaned in acetone and deionized water each for 15 minutes, to remove contaminants such as oil stains on the surface of the copper film.

The base substrate can then be placed in a constant temperature zone in a reaction chamber for graphene growth. The growth process of the graphene is as follows. In a first step, the reaction chamber is evacuated to vacuum and filled with oxygen. This operation is repeated three times or so such that the air in the reaction chamber is discharged and the reaction chamber is filled with an oxygen atmosphere. In a second step, the temperature of the reaction chamber is raised to 500° C. in an oxygen atmosphere with a flow rate of 300 standard milliliters per minute (sccm), and then kept constant for 20 min, so that the oxide on the surface of the copper film is reduced by high temperature annealing. The temperature of the reaction chamber can then be adjusted to a temperature required for growth, and the flow rate of the oxygen is also adjusted to a flow rate required for growth. At the same time, argon gas is fed in at 80 sccm, and the temperature is again kept constant for 20 min. In a third step, methane is fed in at 7 sccm with the flow rate of other gases being kept constant, and the graphene starts to grow. The methane feed time is 15 min. In a fourth step, the feeding of the methane is stopped, and the temperature of the reaction chamber is started to be cooled at a temperature decreasing rate of 10° C./min until a room temperature is reached. During this cooling process, the argon flow rate remains unchanged, and the oxygen flow rate is reduced by 30 sccm to avoid an etching effect on the resultant graphene film due to an excessive flow rate of the oxygen. In the formation of the graphene, the copper film can be used as a catalyst for graphene growth.

Figure 5D:
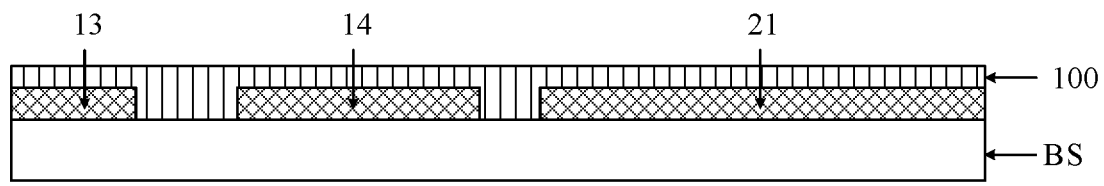
FIG. 5D is a schematic cross-sectional view showing a structure obtained by forming a graphene layer on the electrodes of FIG. 5C.

After the graphene growth is completed, the surface of the base substrate BS would be covered with a layer of graphene 100, as shown in FIG. 5D. Next, a patterned photoresist mask may be formed on the surface of the graphene 100 by a photolithography process, which photoresist mask may cover the graphene in the active region and the graphene in the pixel region. Portions of the graphene that are not covered by the photoresist mask may be removed by an etching process to obtain the active layer as well as the graphene film layer located in the pixel region. The etching process may be a dry etching process using hydrogen plasma, wherein the hydrogen flow rate is controlled at 50 sccm, the substrate temperature at 300° C., the plasma power at 100 W, and the etching rate within 5 nm/min.

Figure 5E:
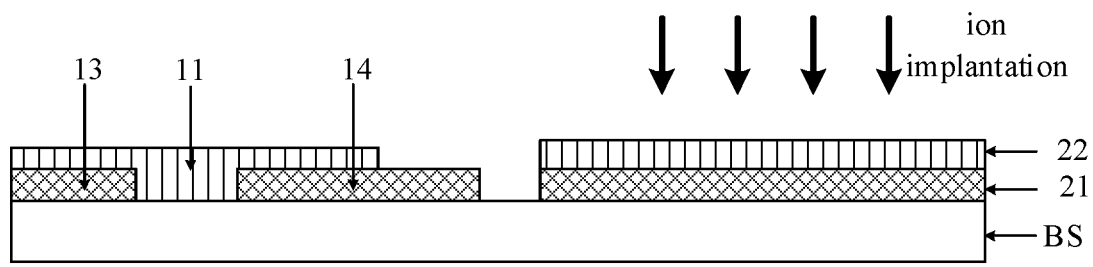
FIG. 5E is a schematic view showing formation of an active layer and a first buffer layer using the graphene layer of FIG. 5D.

Finally, referring to FIG. 5E, impurities are introduced into the graphene film layer by means of N+ ion implantation, thereby obtaining the first buffer layer 22. For example, at a sink voltage of 20 kiloelectron volts (keV), clusters of N+ ions are implanted into the graphene at a dose of $8 \times 10^{15}/cm^2$. Thereafter, the implanted sample is rapidly thermally annealed in an ammonia atmosphere, for example, at a temperature of 450° C. for 50 min, with the vacuum degree maintained at 0.1 Pa. When the temperature of the annealing furnace is naturally cooled to 200° C. (with a cooling rate of 58° C./min to 8° C./min), the base substrate BS is pulled out into the air.

Figure 5F:
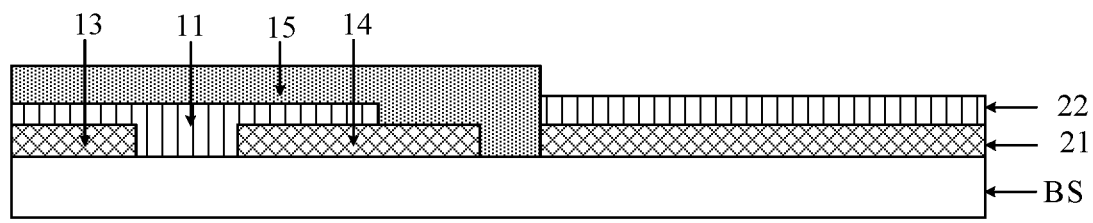
FIG. 5F is a schematic cross-sectional view showing a structure obtained by forming a gate insulating layer on the active layer of FIG. 5E.
Figure 5G:
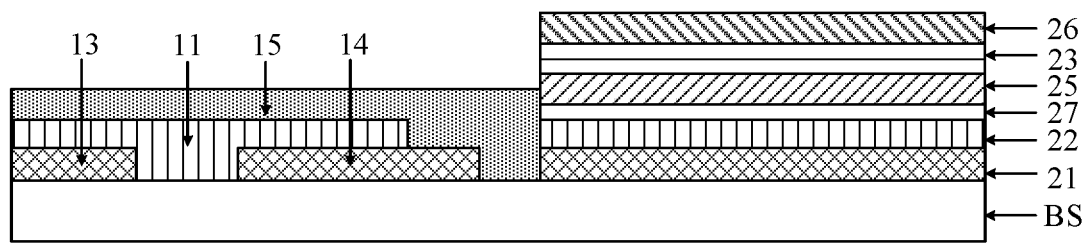
FIG. 5G is a schematic cross-sectional view showing a structure obtained by forming a second buffer layer, a first semiconductor layer, a light emitting layer, and a second semiconductor layer on the first buffer layer of FIG. 5F.

At step 1013a, a gate insulating layer is formed on a side of the active layer away from the base substrate. A gate insulating film layer is deposited on the surface of the base substrate BS having formed thereon the active layer 11 and the first buffer layer 22. Then, portions of the gate insulating film layer on the surface of the first buffer layer 22 are removed by a photolithography process, thereby obtaining the gate insulating layer 15. For example, referring to FIG. 5F, the gate insulating layer 15 does not cover the surface of the first buffer layer 22.

The gate insulating film layer may be a single layer film formed of any one of silicon oxide (SiOx), silicon nitride (SiNx), germanium oxide (HfOx), silicon oxynitride (SiON), or aluminum oxide (AlOx), or a multilayer composite film formed of several ones of the above materials. For example, in an embodiment, the gate insulating film layer may be a two-layer thin film composed of silicon oxide ($SiO_2$) having a thickness of 30 nm to 100 nm and silicon nitride (SiN) having a thickness of 20 nm to 100 nm. The $SiO_2$ film is on the top layer, and the SiN film is on the bottom layer, that is, the $SiO_2$ film is formed on a side of the SiN film away from the base substrate.

At step 1014a, a second buffer layer, a first semiconductor layer, a light emitting layer, and a second semiconductor layer are formed sequentially on a side of the first buffer layer away from the base substrate.

In an embodiment, a GaN film is deposited on the surface of the first buffer layer as a second buffer layer by metalorganic chemical vapor deposition (MOCVD), and then the first semiconductor layer, the light emitting layer and the second semiconductor layer are formed in sequence. The second buffer layer can improve the epitaxial lattice quality of the semiconductor layers to be formed subsequently. The first semiconductor layer may be an N-type semiconductor layer, and the second semiconductor layer may be a P-type semiconductor layer. Depending upon the color of the micro LED, it may be possible to select a material such as InGaN, InAlGaP, GaP, GaAsP or AlGaAs to form the light emitting layer. The light emitting layer can also be referred to as a quantum well. In an embodiment, in order to remove impurities such as oil stain adhered to the surface of the first buffer layer in the base substrate, the base substrate may be washed several times with anhydrous ethanol, and then it is sequentially placed in acetone, anhydrous ethanol and deionized water and ultrasonically cleaned for 10 minutes in each of them. Next, it is rinsed repeatedly with deionized water, and finally dried with high purity nitrogen ($N_2$).

In depositing the second buffer layer by MOCVD, trimethylgallium (TMGa) can be used as the gallium source. A TMGa bubbler is placed in a cold trap so as to be maintained at a temperature of −12.6 degrees Celsius, and low temperature deposition (with a deposition temperature less than 500 degrees Celsius) is performed on the base substrate having formed thereon the gate insulating the layer, with $H_2$ used as a carrier gas and high purity $N_2$ with a purity of 5N (i.e., 99.999%) as a nitrogen source. The power of the microwave source is fixed at 650 W. During the deposition of the GaN film, the base vacuum degree is higher than $5.0 \times 10^{-4}$ Pa and the deposition time is 30 min. A GaN low temperature buffer layer having a thickness of about 20 nm is deposited in an environment of 300 degrees Celsius under the conditions of a flow rate of 0.4 sccm for TMsc and 80 sccm for nitrogen, and a deposition time of 5 min. During the deposition of the GaN film, the substrate temperature may be raised to 430° C., with the flow rates of TMGa and nitrogen maintained at 0.4 sccm and 80 sccm, respectively, and the deposition time increased to 30 min.

In some embodiments, instead of forming the second buffer layer using GaN, the second buffer layer may also be formed using a material such as GaAs or InP. The graphene used to form the first buffer layer has the same crystal structure as a material such as GaAs and GaN, and thus is advantageous for epitaxial growth. Although its lattice constant and thermal expansion coefficient do not match those of the III-V semiconductor material to be epitaxially grown, the graphene has low cost and a light transmittance of 90%, which is suitable for a laser heating process.

Further, referring to FIG. 5Q a first semiconductor layer 25, a light emitting layer 23, and a second semiconductor layer 26 may be sequentially formed on the surface of the second buffer layer 27 by an MOCVD process. Specifically, the base substrate may be heated to a high temperature of about 600 degrees Celsius, and TMGa and ammonia ($NH_3$) precursors are simultaneously introduced into the reaction chamber, thereby sequentially forming on the surface of the second buffer layer 27 an N-type GaN semiconductor layer 25, an InGaN or GaN quantum well 23, and a P-type GaN semiconductor layer 26.

In some embodiments, the first semiconductor layer 25 and the second semiconductor layer 26 may be formed using an in-situ deposition state doping technique. This formation process can be as follows. A silicon precursor such as silane ($SiH_4$), disilane ($Si_2H_6$), dimethylsilane ($SiCH_8$) or dichlorodihydrosilane ($SiH_2Cl_2$) is added to the reaction chamber at the same time while TMGa and $NH_3$ are fed in, so that the GaN is doped with Si of $10^{17}$ to $10^{20}$ $cm^{-3}$ (i.e., $10^{17}$ to $10^{20}$ Si atoms are doped per cubic centimeter of GaN), thereby forming an N-type GaN semiconductor layer 25. Thereafter, an organic precursor of magnesium such as magnesium pentoxide ($Cp_2Mg$) is added to the reaction chamber, so that Mg of $10^{17}$ to $10^{20}$ $cm^{-3}$ is doped into the GaN, thereby forming a P-type GaN semiconductor layer 26. Between the formation of the N-type semiconductor layer 25 and the P-type semiconductor layer 26, a wide band gap material and a narrow band gap semiconductor material, which each have a thickness in the order of nanometer, may be alternately deposited by an MOCVD process. For example, a wide band gap material of aluminum gallium nitride (AlGaN) and a narrow band gap material of GaN are alternately deposited to form a variety of single quantum well structures or multiple quantum well structures. The lattice constants of the wide band gap material and the narrow band gap material in the quantum well material match, and so do the bands (the band difference of these two materials is kept within a certain range (e.g., 1 eV)), so that the wavelength of the emission can be modulated. The quantum well structure also has the advantages of high recombination efficiency and a low interfacial recombination rate.

In an embodiment, the thickness of the second buffer layer 27 may be between 0.1 and 5 microns, the thickness of the first semiconductor layer 25 and the second semiconductor layer 26 may be between 0.1 and 0.5 microns, and the thickness of the quantum well 23 may be between 0.1 and 0.5 microns. In forming the second buffer layer, the first semiconductor layer, the light emitting layer, and the second semiconductor layer, the entire surface of the base substrate may be covered by the second buffer layer, the first semiconductor layer, the light emitting layer, and the second layer, and portions of these film layers that are not in the display region are then removed by a photolithography process, leaving only portions of the film layers that are located in the pixel region.

At step 1015a, a gate electrode is formed on a side of the gate insulating layer away from the base substrate. A metal thin film is deposited on the surface of the gate insulating layer, and then the metal thin film can be processed by a one-time patterning process to obtain the gate electrode of the thin film transistor.

Figure 5H:
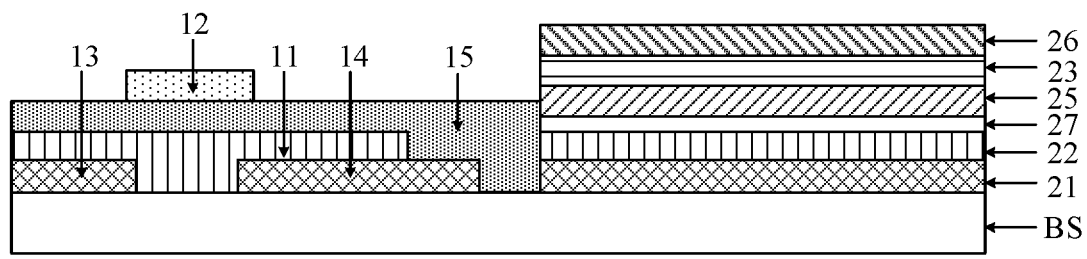
FIG. 5H is a schematic cross-sectional view showing a structure obtained by forming a gate electrode on the gate insulating layer of FIG. 5G.

In an embodiment, a metal thin film having a thickness of 200 to 500 nm is deposited on the surface of the base substrate by magnetron sputtering. The metal film may be a film layer formed of one of molybdenum (Mo), molybdenum-niobium alloy (MoNb), Al, aluminum-niobium alloy (AlNd), titanium (Ti), and copper (Cu), or may be a single or multiple layer composite laminate formed from several ones of the above materials. For example, a Mo film layer or an Al film layer may be formed on the surface of the base substrate, or a single layer film or a multilayer composite film composed of an alloy of Mo and Al may be formed. Thereafter, a patterned photoresist mask can be formed on the surface of the base substrate by a photolithography process to define a gate region of the thin film transistor. Finally, a region of the metal film not covered by the photoresist mask can be etched, and the gate electrode 12 of the thin film transistor can be obtained, as shown in FIG. 5H.

Figure 5I:
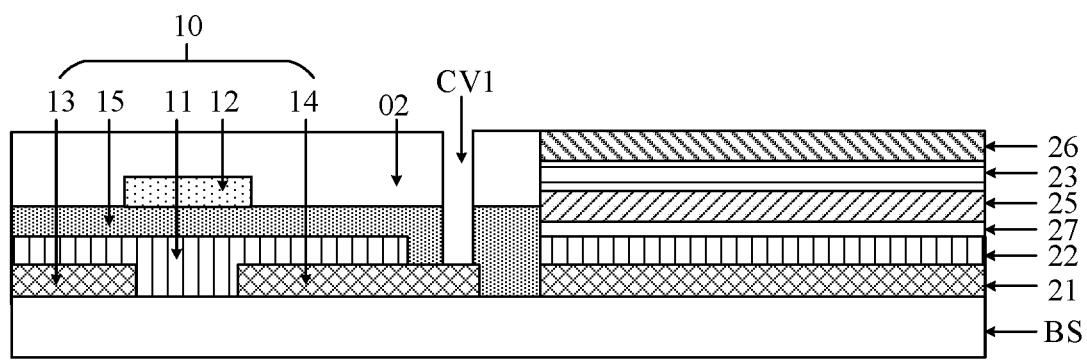
FIG. 5I is a schematic cross-sectional view showing a structure obtained by forming a passivation layer on the gate electrode and the gate insulating layer of FIG. 5H and forming a first contact via in the passivation layer and the gate insulating layer.

At step 1016a, a passivation layer is formed on a side of the gate electrode away from the base substrate. As shown in FIG. 5I, a passivation layer 02 is formed on a side of the gate electrode 12 away from the base substrate BS. The passivation layer 02 may be a $SiN_x$ layer or may be composed of a SiOx layer and a $SiN_x$ layer that are stacked.

At step 1017a, a first contact via extending through the passivation layer and the gate insulating layer is formed on the base substrate to expose the second electrode of the thin film transistor. With continued reference to FIG. 5I, the passivation layer 02 and the gate insulating layer 15 may be processed by a photolithography process to form a first contact via 021 in the passivation layer 02 and the gate insulating layer 15. The first contact via 021 may expose a contact region of the second electrode 14 of the thin film transistor 10.

It will be understood that the passivation layer formed in the above step 1016a may be overlaid on the whole surface of the base substrate BS, and portions of the passivation layer overlying the second semiconductor layer 26 may be removed in step 1017a. Thereby, the passivation layer 02 is formed only in the non-display area.

At step 1018a, a second electrode is formed on a side of the second semiconductor layer away from the base substrate, and the second electrode is connected to the second electrode of the thin film transistor through the first contact via. A metal thin film may be deposited on the surfaces of the passivation layer and the second semiconductor layer, and then the metal thin film is patterned by a photolithography process to form the second electrode of the micro LED. The second electrode can be in contact with the second electrode 14 of the thin film transistor 10 through the first contact via CV1 for connection of the second electrode of the micro LED to the second electrode of the thin film transistor. A schematic cross-sectional view of the finally formed array substrate can be seen in FIG. 2A.

In the above steps, the metal thin film may be formed of any one of metal materials such as Cu, Al, Mo, Ti, chromium (Cr), or tungsten (W). Alternatively, the metal film may also be a multilayer metal film structure composed of a plurality of metal materials. For example, the metal thin film may be a three-layer metal thin film, and the metal materials forming the three-layer metal thin film may be Mo, Al, and Mo, or Ti, Al, and Ti, or Ti, Cu, Ti, or Mo, Cu, and Ti.

In an alternative embodiment, the first electrode of the micro LED and the second electrode of the thin film transistor that are formed in the above step 1011a may be of an integral structure. Accordingly, step 1017a can be omitted. In step 1018a, the second electrode of the micro LED may be formed only on the surface of the second semiconductor layer, and the second electrode is connected to a common electrode line.

A method for manufacturing an array substrate provided by an embodiment of the present disclosure is described in detail below by taking the thin film transistor of a bottom gate structure shown in FIG. 3A as an example.

Figure 6A:
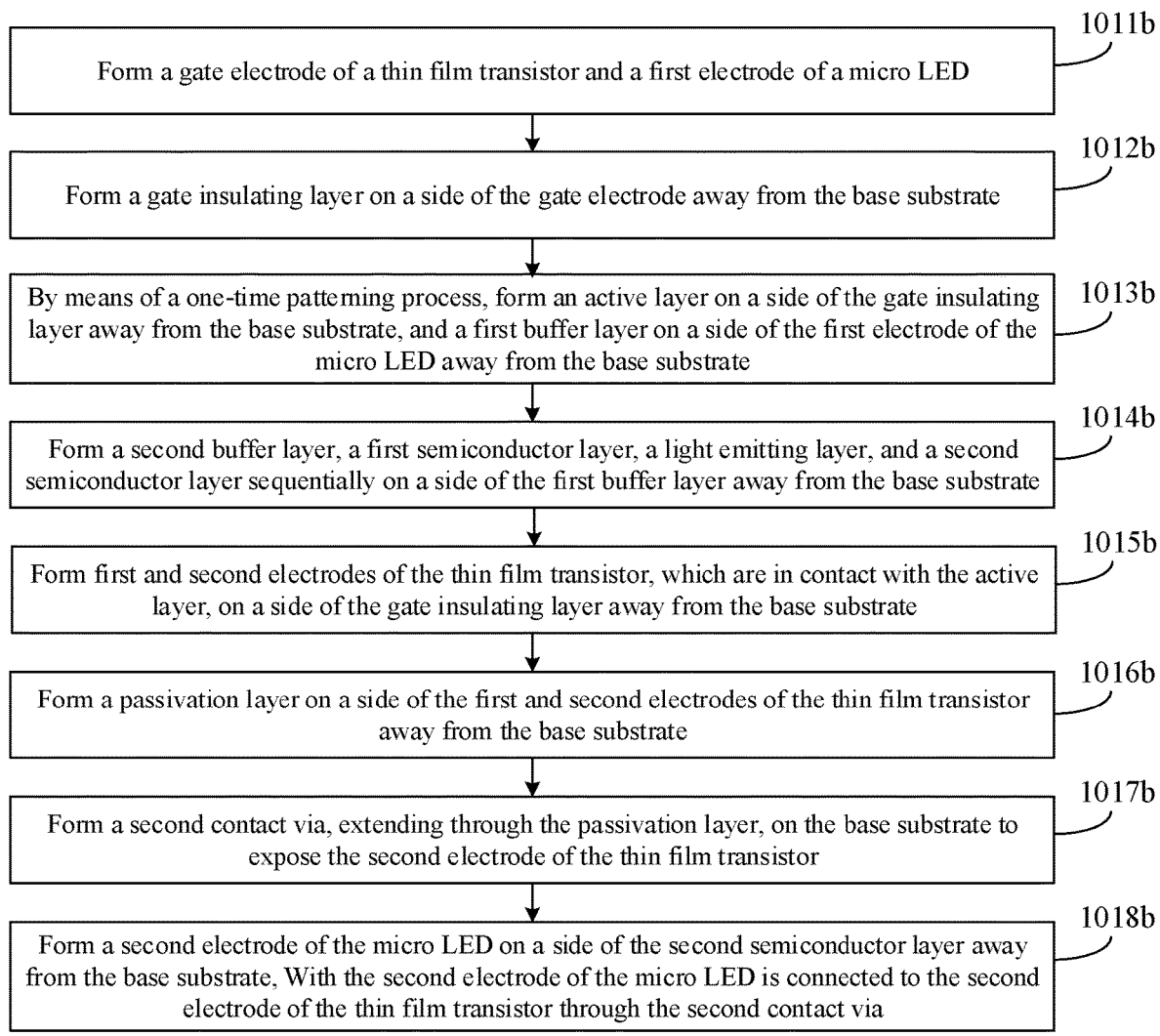
FIG. 6A is a flowchart of a method of manufacturing an array substrate according to another embodiment of the present disclosure.

Referring to FIG. 6A, the method of manufacturing the array substrate includes the following steps.

At step 1011b, a gate electrode of a thin film transistor and a first electrode of a micro LED, spaced apart from each other, are formed on a base substrate.

At step 1012b, a gate insulating layer is formed on a side of the gate electrode away from the base substrate. The gate insulating layer does not cover the surface of the first electrode.

At step 1013b, by means of a one-time patterning process, an active layer is formed on a side of the gate insulating layer away from the base substrate, and a first buffer layer on a side of the first electrode of the micro LED away from the base substrate.

At step 1014b, a second buffer layer, a first semiconductor layer, a light emitting layer, and a second semiconductor layer are sequentially formed on a side of the first buffer layer away from the base substrate.

At step 1015b, first and second electrodes of the thin film transistor, which are in contact with the active layer, are formed on a side of the gate insulating layer away from the base substrate.

At step 1016b, a passivation layer is formed on a side of the first and second electrodes of the thin film transistor away from the base substrate.

At step 1017b, a second contact via, extending through the passivation layer, is formed on the base substrate to expose the second electrode of the thin film transistor.

At step 1018b, a second electrode of the micro LED is formed on a side of the second semiconductor layer away from the base substrate, and the second electrode of the micro LED is connected to the second electrode of the thin film transistor through the second contact via.

The structure of the finally formed array substrate is shown in FIG. 3A. For the specific implementation process of the foregoing steps 1011b to 1018b, reference may be made to the corresponding steps described above with respect to FIG. 5A, and details are not described herein again.

A method for manufacturing an array substrate provided by an embodiment of the present disclosure is described in detail below by taking the thin film transistor of a bottom gate structure shown in FIG. 3B as an example.

Figure 6B:
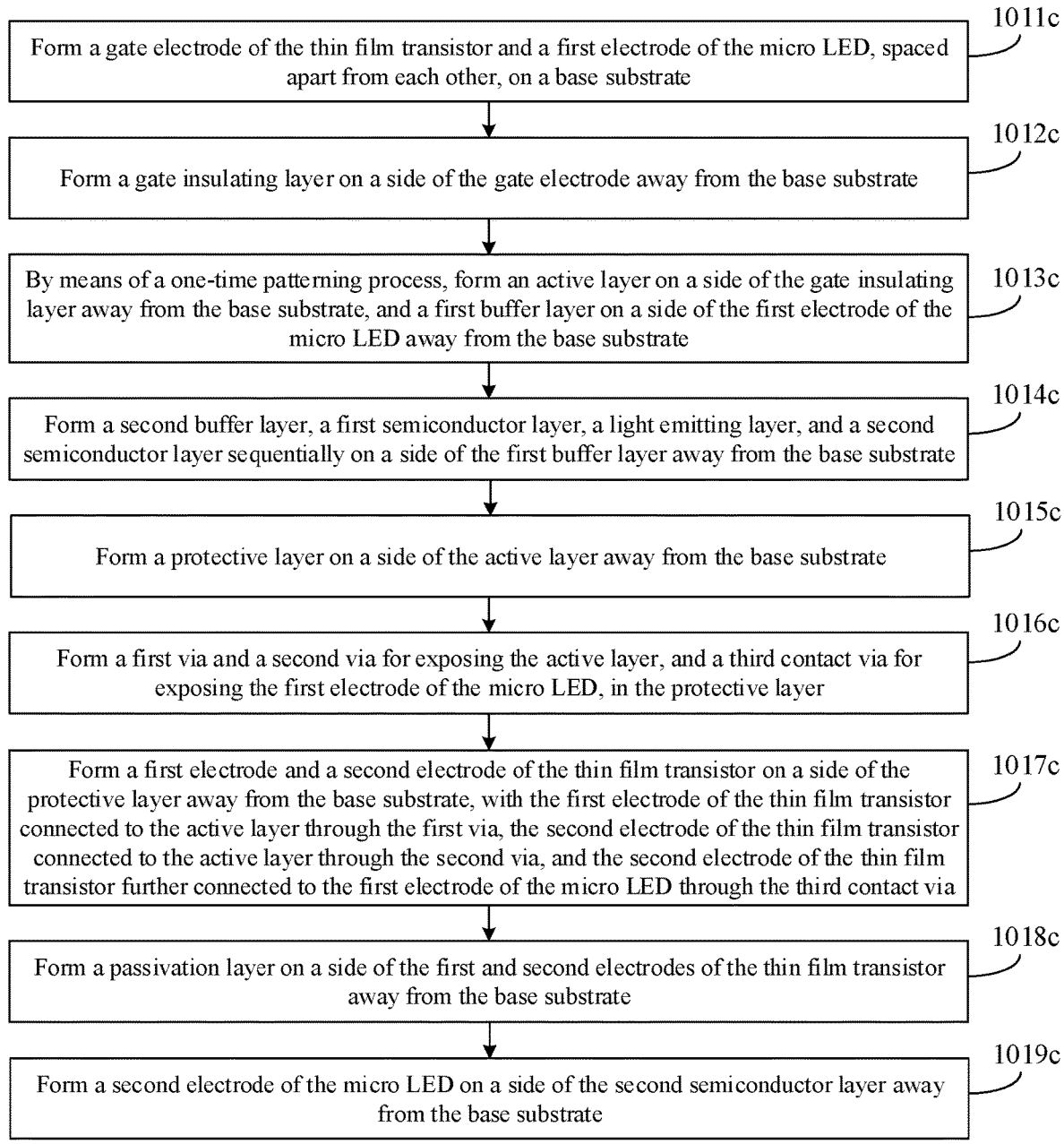
FIG. 6B is a flowchart of a method of manufacturing an array substrate according to another embodiment of the present disclosure.

Referring to FIG. 6B, the method of manufacturing the array substrate includes the following steps.

At step 1011c, a gate electrode of the thin film transistor and a first electrode of the micro LED are formed on a base substrate.

At step 1012c, a gate insulating layer is formed on a side of the gate electrode away from the base substrate. The gate insulating layer does not cover the surface of the first electrode of the micro LED.

At step 1013c, by means of a one-time patterning process, an active layer is formed on a side of the gate insulating layer away from the base substrate, and a first buffer layer on a side of the first electrode of the micro LED away from the base substrate.

At step 1014c, a second buffer layer, a first semiconductor layer, a light emitting layer, and a second semiconductor layer are sequentially formed on a side of the first buffer layer away from the base substrate.

At step 1015c, a protective layer is formed on a side of the active layer away from the base substrate.

At step 1016c, a first via and a second via for exposing the active layer, and a third contact via for exposing the first electrode of the micro LED, are formed in the protective layer.

At step 1017c, a first electrode and a second electrode of the thin film transistor are formed on a side of the protective layer away from the base substrate, with the first electrode of the thin film transistor connected to the active layer through the first via, the second electrode of the thin film transistor connected to the active layer through the second via, and the second electrode of the thin film transistor further connected to the first electrode of the micro LED through the third contact via.

At step 1018c, a passivation layer is formed on a side of the first and second electrodes of the thin film transistor away from the base substrate.

At step 1019c, a second electrode of the micro LED is formed on a side of the second semiconductor layer away from the base substrate.

For the specific implementation process of the foregoing steps 1011c to 1019c, reference may be made to the corresponding steps described above with respect to FIG. 5A, and details are not described herein again.

In embodiments, by forming the buffer layer of the micro LED and the active layer of the thin film transistor in the same layer, the thin film transistor and the micro LED can be synchronously formed in the manufacturing process, thereby effectively simplifying the manufacturing process of the array substrate and reducing the manufacturing cost of the display device. It will be understood that in various embodiments, the steps may be performed differently than described, and some of the steps may even be omitted where appropriate. For example, step 1014a may alternatively be performed after step 1015a.

Figure 7:
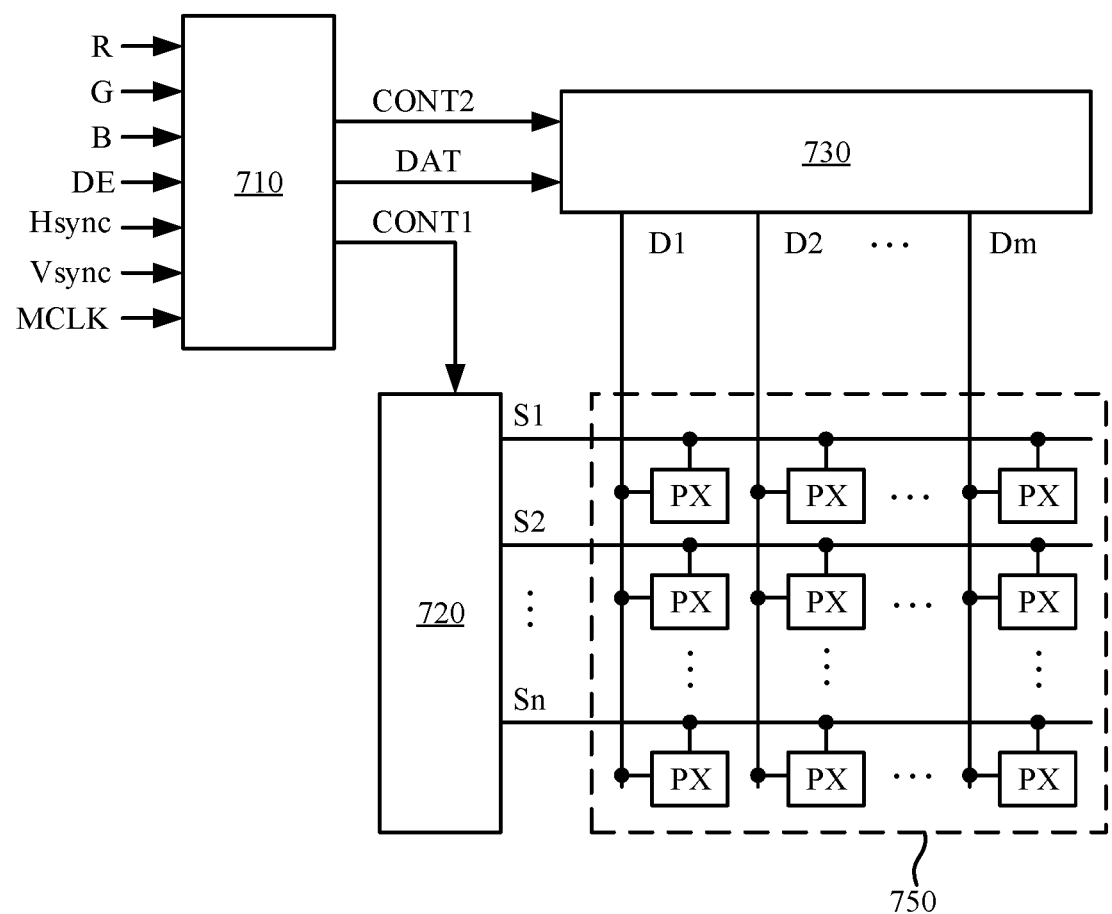
FIG. 7 is a schematic block diagram of a display device in accordance with an embodiment of the present disclosure.

FIG. 7 is a schematic block diagram of a display device in accordance with an embodiment of the present disclosure. The display device may be any product or component having a display function such as a liquid crystal panel, an electronic paper, a mobile phone, a tablet computer, a television, a display, a notebook computer, a digital photo frame, a navigator, and the like.

Referring to FIG. 7, the display device includes a timing controller 710, a scan driver 720, a data driver 730, and a display substrate 750.

The timing controller 710 receives synchronization signals and video signals R, G, and B from a system interface. The synchronization signals include a horizontal synchronization signal Hsync, a vertical synchronization signal Vsync, a main clock signal MCLK, and a data enable signal DE. The video signals R, G, and B contain luminance information for each of a plurality of pixels PX. The timing controller 710 generates a first driving control signal CONT1, a second driving control signal CONT2, and an image data signal DAT based on the video signals R, G, and B, the horizontal synchronization signal Hsync, the vertical synchronization signal Vsync, the data enable signal DE, and the main clock signal MCLK.

The display substrate 750 includes pixels PX that are arranged in substantially a matrix form. In the display substrate 750, a plurality of substantially parallel scan lines S1 to Sn extend in a row direction, and a plurality of substantially parallel data lines D1 to Dm extend in a column direction. The scan lines Si to Sn and the data lines D1 to Dm are coupled to the pixels PX. The display substrate 750 may take the form of any one of the array substrate embodiments described above with respect to FIGS. 1 to 3B.

The scan driver 720 is coupled to the scan lines S1-Sn, and generates a plurality of corresponding scan signals S[1] to S[n] based on the first driving control signal CONT1. The scan driver 720 can sequentially apply the scan signals S[1] to S[n] to the scan lines Si to Sn.

The data driver 730 is coupled to the data lines D1 to Dm, samples and holds the image data signal DAT based on the second driving control signal CONT2, and applies a plurality of data signals D[1] to D[m] to the data lines D1 to Dm, respectively. The data driver 730 can program the data to the pixels PX by applying the data signals D[1] to D[m] to the data lines D1 to Dm in synchronization with the scan signals S[1] to S[n].

The foregoing is only specific embodiments of the present application and is not intended to limit the application. Modifications, equivalent substitutions or improvements can be made by a person having ordinary skill in the art to the described embodiments without departing from the scope of the present application.

What is claimed is:

1. An array substrate, comprising:
   a base substrate;
   a thin film transistor on the base substrate, the thin film transistor comprising a gate electrode connected to a gate line, an active layer, a gate insulating layer insulating the gate electrode from the active layer, a first electrode connected to a data line, and a second electrode spaced apart from the first electrode; and
   a micro light emitting diode on the base substrate, the micro light emitting diode comprising a first electrode on the base substrate, a first buffer layer on a side of the first electrode away from the base substrate, a second buffer layer on a side of the first buffer layer away from the base substrate, a light emitting layer on a side of the second buffer layer away from the base substrate and a second electrode on a side of the light emitting layer away from the base substrate, a material of the second buffer layer being different from a material of the first buffer layer, and a crystal structure of the material of the second buffer layer being substantially same as a crystal structure of the material of the first buffer layer,
   wherein the first buffer layer and the active layer are in a first layer, and
   wherein the second electrode of the thin film transistor is connected to one of the first electrode of the micro light emitting diode or the second electrode of the micro light emitting diode.

2. The array substrate of claim 1, wherein the micro light emitting diode further comprises a first semiconductor layer between the light emitting layer and the first buffer layer, and a second semiconductor layer between the light emitting layer and the second electrode of the micro light emitting diode.

3. The array substrate of claim 2,
   wherein the second buffer layer is between the first semiconductor layer and the first buffer layer,
   wherein the first buffer layer and the active layer comprise a same material.

4. The array substrate of claim 3,
   wherein the first buffer layer comprises at least one of graphene, zinc oxide, zinc sulfide, silicon carbide, or aluminum nitride, and
   wherein the second buffer layer comprises at least one of gallium nitride, gallium arsenide, aluminum gallium arsenide, aluminum gallium nitride, or indium phosphide.

5. A display device comprising the array substrate of claim 4.

6. A display device comprising the array substrate of claim 2.

7. A display device comprising the array substrate of claim 3.

8. The array substrate of claim 1,
   wherein the thin film transistor comprises a top gate structure,
   wherein the first electrode of the micro light emitting diode, the first electrode of the thin film transistor, and the second electrode of the thin film transistor are in a second layer,
   wherein the second electrode of the thin film transistor is connected to the second electrode of the micro light emitting diode through a first contact via in the gate insulating layer, and
   wherein the first electrode of the micro light emitting diode is configured to receive a common electrode voltage.

9. The array substrate of claim 1,
   wherein the thin film transistor comprises a top gate structure,
   wherein the first electrode of the micro light emitting diode, the first electrode of the thin film transistor, and the second electrode of the thin film transistor are in a second layer,
   wherein the second electrode of the thin film transistor and the first electrode of the micro light emitting diode are of an integral structure, and
   wherein the second electrode of the micro light emitting diode is configured to receive a common electrode voltage.

10. The array substrate of claim 1,
    wherein the thin film transistor comprises a bottom gate structure,
    wherein the first electrode of the micro light emitting diode and the gate electrode are in a third layer and spaced apart from each other,
    wherein the array substrate further comprises a passivation layer on a side of the first and second electrodes of the thin film transistor away from the base substrate,
    wherein the second electrode of the thin film transistor is connected to the second electrode of the micro light emitting diode through a second contact via in the passivation layer, and
    the first electrode of the micro light emitting diode is configured to receive a common electrode voltage.

11. The array substrate of claim 1,
    wherein the thin film transistor comprises a bottom gate structure,
    wherein the first electrode of the micro light emitting diode and the gate electrode are in a third layer and spaced apart from each other,
    wherein the thin film transistor further comprises a protective layer on a side of the active layer away from the base substrate, wherein the first and second electrodes of the thin film transistor are on a side of the protective layer away from the base substrate, wherein the first electrode of the thin film transistor is connected to the active layer through a first via in the protective layer, wherein the second electrode of the thin film transistor is connected to the active layer through a second via in the protective layer, wherein the second electrode of the thin film transistor is further connected to the first electrode of the micro light emitting diode through a third contact via in the protective layer, and wherein the second electrode of the micro light emitting diode is configured to receive a common electrode voltage.

12. A display device comprising the array substrate of claim 1.

13. A method of manufacturing an array substrate, comprising:

forming a thin film transistor and a micro light emitting diode on a base substrate, the thin film transistor comprising a gate electrode connected to a gate line, an active layer, a gate insulating layer insulating the gate electrode from the active layer, a first electrode connected to a data line, and a second electrode spaced apart from the first electrode, the micro light emitting diode comprising a first electrode on the base substrate, a first buffer layer on a side of the first electrode away from the base substrate, a second buffer layer on a side of the first buffer layer away from the base substrate, a light emitting layer on a side of the second buffer layer away from the base substrate and a second electrode on a side of the light emitting layer away from the base substrate, a material of the second buffer layer being different from a material of the first buffer layer, and a crystal structure of the material of the second buffer layer being substantially the same as a crystal structure of the material of the first buffer layer, wherein the first buffer layer and the active layer are in a first layer; and connecting the second electrode of the thin film transistor to one of the first electrode of the micro light emitting diode or the second electrode of the micro light emitting diode.

14. The method of claim 13, wherein the micro light emitting diode further comprises a first semiconductor layer and a second semiconductor layer, and wherein the forming the micro light emitting diode comprises sequentially forming, in a direction away from the base substrate, the first electrode of the micro light emitting diode, the first buffer layer, the second buffer layer, the first semiconductor layer, the light emitting layer, the second semiconductor layer, and the second electrode of the micro light emitting diode.

15. The method of claim 14, wherein the first semiconductor layer is formed on a side of the second buffer layer away from the base substrate, and wherein the first buffer layer and the active layer are formed of a same material.

16. The method of claim 13, wherein the thin film transistor comprises a top gate structure, and wherein the forming the thin film transistor and the micro light emitting diode comprises integrally forming the second electrode of the thin film transistor and the first electrode of the micro light emitting diode by a one-time patterning process.

17. The method of claim 13, wherein the thin film transistor comprises a top gate structure, and wherein after the forming the thin film transistor, the method further comprises:

forming a first contact via that extends through the gate insulating layer to expose the second electrode of the thin film transistor, and wherein the second electrode of the micro light emitting diode is formed after formation of the first contact via, and is connected to the second electrode of the thin film transistor through the first contact via.

18. The method of claim 13, wherein the thin film transistor comprises a bottom gate structure, and wherein the forming the thin film transistor and the micro light emitting diode comprises forming in a third layer the first electrode of the micro light emitting diode and the gate electrode by a one-time patterning process.

19. The method of claim 18, wherein after the forming the thin film transistor, the method further comprises:

forming a passivation layer on a side of the first and second electrodes of the thin film transistor away from the base substrate; and forming a second contact via that extends through the passivation layer to expose the second electrode of the thin film transistor, wherein the second electrode of the micro light emitting diode is formed after formation of the second contact via, and is connected to the second electrode of the thin film transistor through the second contact via.

20. The method of claim 18, wherein after the forming the active layer, the method further comprises:

forming a protective layer on a side of the active layer away from the base substrate; and exposing the active layer by forming a first via and a second via in the protective layer and exposing the first electrode of the micro light emitting diode by forming a third contact via in the protective layer, wherein the first and second electrodes of the thin film transistor are formed on a side of the protective layer away from the base substrate, wherein the first electrode of the thin film transistor is connected to the active layer through the first via, and wherein the second electrode of the thin film transistor is connected to the active layer through the second via and connected to the first electrode of the micro light emitting diode through the third contact via.

* * * * *